(12) United States Patent
Demir

(10) Patent No.: US 7,236,547 B2
(45) Date of Patent: Jun. 26, 2007

(54) START-UP AUTOMATIC FREQUENCY CONTROL (AFC) METHOD AND APPARATUS

(75) Inventor: Alpaslan Demir, Commack, NY (US)

(73) Assignee: InterDigital Technology Corporation, Wilmington, DE (US)

(*) Notice: Subject to any disclaimer, the term of this patent is extended or adjusted under 35 U.S.C. 154(b) by 0 days.

(21) Appl. No.: 11/088,116

(22) Filed: Mar. 23, 2005

(65) Prior Publication Data

US 2005/0163266 A1 Jul. 28, 2005

Related U.S. Application Data

(63) Continuation of application No. 10/629,429, filed on Jul. 29, 2003.

(60) Provisional application No. 60/399,818, filed on Jul. 31, 2002.

(51) Int. Cl.
*H04L 27/06* (2006.01)

(52) U.S. Cl. .................. 375/344; 375/149; 375/150; 342/199; 370/342; 370/347; 370/503

(58) Field of Classification Search ............ 375/344, 375/149, 150; 324/199; 370/342, 347, 503
See application file for complete search history.

(56) References Cited

U.S. PATENT DOCUMENTS

| 5,574,754 | A | 11/1996 | Kurihara et al. ............ 375/367 |
|---|---|---|---|
| 5,994,932 | A | 11/1999 | Ando |
| 6,160,841 | A * | 12/2000 | Stansell et al. ............. 375/148 |
| 6,222,874 | B1 | 4/2001 | Walley et al. |
| 6,236,343 | B1 | 5/2001 | Patapoutian |
| 6,313,789 | B1 * | 11/2001 | Zhodzishsky et al. . 342/357.12 |
| 6,327,257 | B1 * | 12/2001 | Khalifa ....................... 370/342 |
| 6,480,558 | B1 * | 11/2002 | Ottosson et al. ............ 375/350 |
| 6,532,255 | B1 * | 3/2003 | Gunzelmann et al. ...... 375/150 |
| 6,597,729 | B1 | 7/2003 | Schmidl et al. |
| 6,775,318 | B2 | 8/2004 | Chen et al. |
| 6,804,315 | B2 | 10/2004 | Demir et al. |
| 6,826,244 | B2 | 11/2004 | Demir et al. |
| 2001/0021199 | A1 * | 9/2001 | Lee et al. .................... 370/503 |
| 2002/0064146 | A1 | 5/2002 | Okuyama |
| 2004/0043746 | A1 * | 3/2004 | Hiramatsu .................. 455/334 |

FOREIGN PATENT DOCUMENTS

| EP | 1 071 224 | 1/2001 |
|---|---|---|
| GB | 2 377 126 | 12/2002 |

* cited by examiner

*Primary Examiner*—Dac Ha
*Assistant Examiner*—Ted M. Wang
(74) *Attorney, Agent, or Firm*—Volpe and Koenig, P.C.

(57) ABSTRACT

Method and apparatus for adjusting the frequency of a voltage controlled oscillator (VCO) at a receiver to synchronize the receiver with the transmitter by correlating a synchronization code channel with training sequences to estimate positive and negative offsets which are employed to estimate an error, which is then filtered. The filter output provides voltage controlling the VCO. The same technique may be employed to control a numeric controlled oscillator (NCO).

22 Claims, 3 Drawing Sheets

PHASE ROTATION APPROACH FOR START_UP AFC

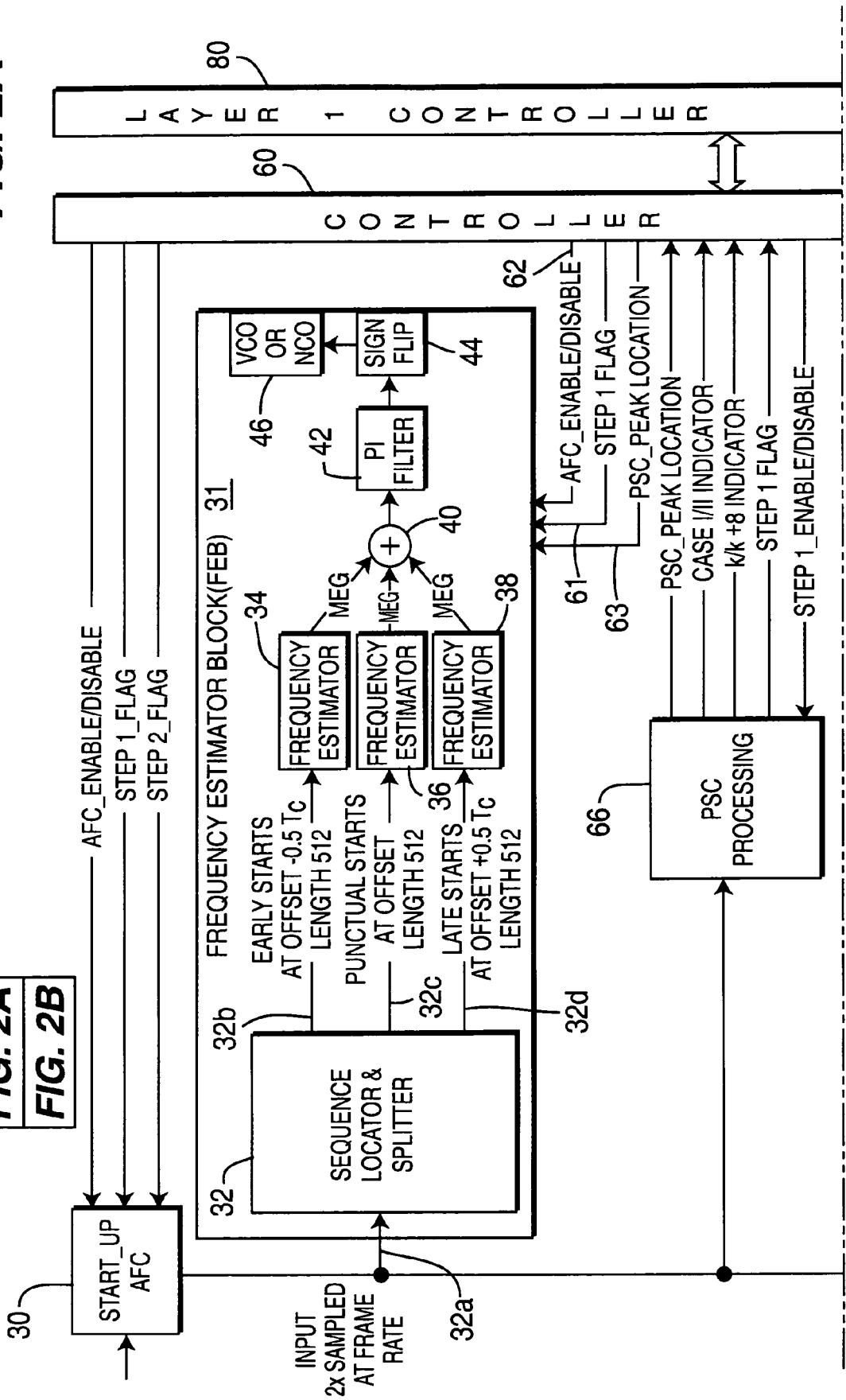

START-UP AUTOMATIC FREQUENCY CONTROL (AFC) METHOD AND APPARATUS

CROSS REFERENCE TO RELATED APPLICATIONS

This application is a continuation of U.S. patent application Ser. No. 10/629,429, filed Jul. 29, 2003 which claims the benefit of U.S. provisional application No. 60/399,818 filed on Jul. 31, 2002, which is incorporated by reference as if fully set forth.

FIELD OF THE INVENTION

The invention relates to a wireless communication system. More particularly, the invention relates to initialization of a communication link between a base station (BS) and a user equipment (UE).

BACKGROUND OF THE INVENTION

During an initial cell search (ICS) or power-up of a UE, a training sequence of known symbols is used by the receiver to estimate the transmitted signal. In a time division duplex (TDD) signal, for example, the midamble of a TDD frame conventionally contains the training sequence of symbols. The conventional cell search process consists of a Step 1 algorithm which processes a primary synchronization code (PSC) on the primary synchronization code channel (PSCH) for synchronization channel (SCH) location determination. A Step 2 algorithm processes the secondary synchronization codes (SSC) for code group determination and timeslot synchronization, and a Step 3 algorithm performs midamble processing.

Variable control oscillators (VCOs) are commonly used at the end of an automatic frequency control (AFC) process to adjustably control the frequency of the receiver to achieve synchronization between a transmitter and a receiver. The input for the VCO is a control voltage signal, which is typically generated by a control circuit that processes the amplitude and phase of the received symbols. A common problem during an AFC process is the initial fluctuations resulting from a potentially significant frequency offset between the transmitter and the receiver.

SUMMARY

A method and apparatus for adjusting the frequency of a VCO at a receiver to synchronize the receiver with the transmitter by correlating a synchronization code channel with training sequences to estimate positive and negative offsets which are employed to estimate an error, which is then filtered. The filter output provides a voltage controlling the VCO. The same technique may be employed to control a numeric controlled oscillator (NCO).

BRIEF DESCRIPTION OF THE DRAWINGS

The invention will be understood from the following description and drawings in which like elements are designated by like numerals and, wherein:

FIGS. 2A and 2B, taken together, comprise a block diagram of the interaction between start-up AFC and algorithm Steps 1, 2 and 3 of cell search.

FIG. 2 shows the manner in which FIGS. 2a and 2b are arranged to create a complete block diagram.

DETAILED DESCRIPTION OF THE PREFERRED EMBODIMENT(S)

Figure 1:
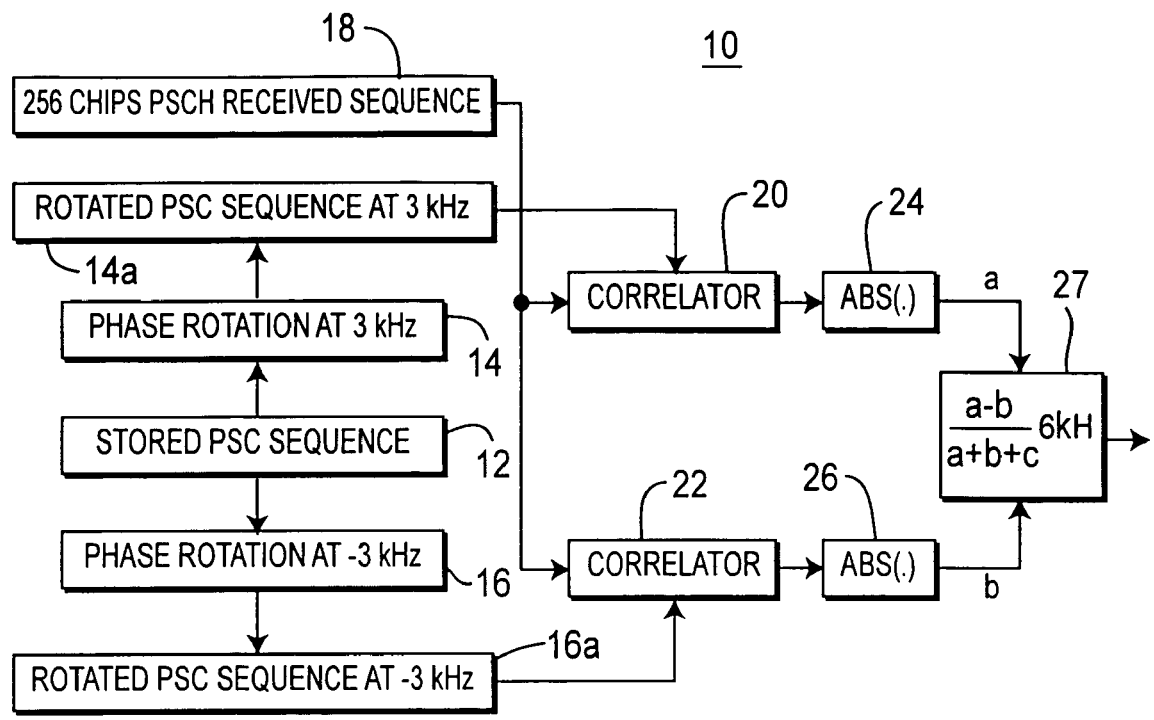
FIG. 1 is a block diagram showing the phase rotation approach for start-up AFC.

FIG. 1 is a block diagram of a start-up adaptive frequency control (AFC) 10 used to reduce the frequency offset between a base station (BS) and user equipment (UE) during initial cell search procedure. Start-up AFC uses a phase rotation approach, which is based on the correlations of two sequences with the primary synchronization code (PSC). The stored PSC sequence 12 is rotated in opposing directions at 14, 14a, 16, 16a to respectively determine correlations with the received sequence 18 at 20 and 22. The absolute values (a and b) are obtained at 24 and 26 and to obtain the value $$\left(\frac{a-b}{a+b+c}\right)$$

6 kHz, from circuit 27, where c is an arbitrary constant provided to prevent division by zero. The phase rotation at −3 kHz alternatively can be replaced by a conjugate of a rotated PSC sequence at 3 kHz since the PSC sequence can only have values of (1+j) and (−1−j).

During start-up AFC process, it is assumed that the PSC location provided is correct. Once Step 1 completes generation of the first outputs, the start-up AFC starts running. The Step 1 process and start-up AFC process run in parallel. Optimally, start-up AFC reduces the frequency offset from 6 kHz to less than 2 kHz in the least number of iterations. Table 1 shows a particular advantage of frequency correction which is an increase in allowable integrations. The number of integrations is limited, however, due to chip slip. The chip-slip upper bound is 0.5 Tc since the maximum correlation is generated one sample later for a method utilizing twice the chip rate sampling. Table 1 summarizes the allowable number of integrations as frequency offset is reduced. Table 2 provides information on performance degradation for a coherent combining technique in the presence of carrier frequency offset.

TABLE 1

Frequency Offset vs. Number of Integration Allowed

| Frequency Offset | Slip per frame | Number of integrations allowed |
| --- | --- | --- |
| ±6 kHz = ±3 ppm | 0.1152 Tc | 4 |
| ±4 kHz = ±2 ppm | 0.0768 Tc | 6 |
| ±2 kHz = ±1 ppm | 0.0384 Tc | 13 |
| ±1 kHz = ±0.5 ppm | 0.0192 Tc | 26 |

TABLE 2

Frequency Offset vs. Code Length for Coherent Combining

| Loss in dB | Length of the code integrated coherently | Carrier frequency Offset Fc = 2 GHz | |
| --- | --- | --- | --- |
| 2.42 | 256 | ±3 ppm | 6 kHz |
| 1.04 | 256 | ±2 ppm | 4 kHz |
| 0.26 | 256 | ±1 ppm | 2 kHz |
| 0.06 | 256 | ±0.5 ppm | 1 kHz |
| 12.62 | 512 | ±3 ppm | 6 kHz |
| 4.53 | 512 | ±2 ppm | 4 kHz |

TABLE 2-continued

Frequency Offset vs. Code Length for Coherent Combining

| Loss in dB | Length of the code integrated coherently | Carrier frequency Offset Fc = 2 GHz | |
|---|---|---|---|
| 1.04 | 512 | ±1 ppm | 2 kHz |
| 0.26 | 512 | ±0.5 ppm | 1 kHz |

The start-up AFC procedure includes a mechanism to realign the primary synchronization code (PSC) position that may shift during correction. The Step 1 procedure can be run to eliminate the need for the mechanism while the start-up AFC algorithm is running. The Step 1 procedure updates the peak location every $4^{th}$ frame.

Figure 2B:
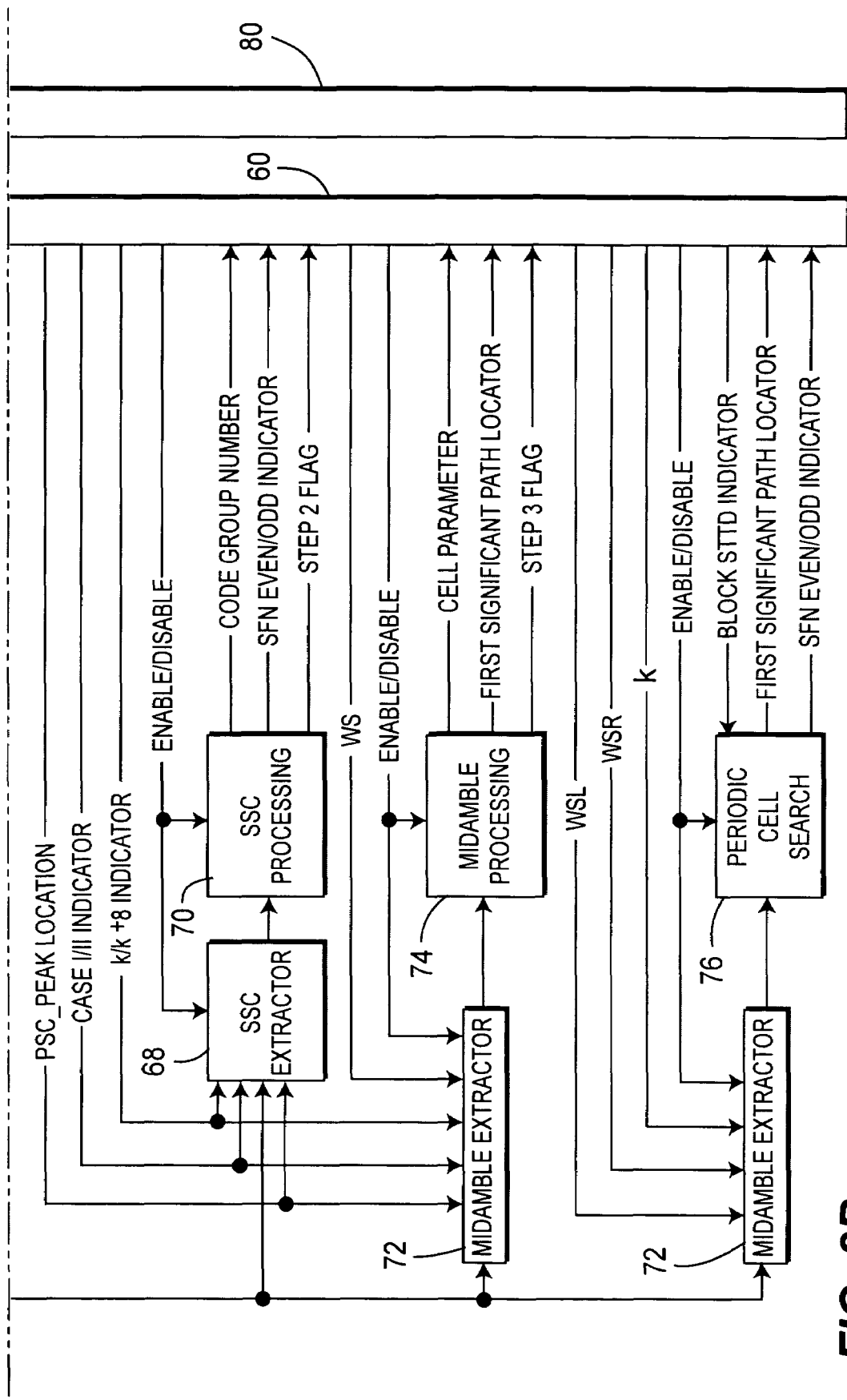

FIG. 2 depicts the parallel processing relationship among start-up AFC and Steps 1, 2 and 3 of cell searching. Of particular concern is the relationship between Step 1 and start-up AFC. Since Step 1 works in parallel with the startup AFC, there is no need for a code tracker circuit to follow a given path. Each time Step 1 updates an output that is based on the largest detected value, start-up AFC uses the new peak location to estimate the new frequency offset.

The frequency estimator block (FEB) 31 of the start-up AFC comprises a Sequence Locator and Splitter 32, frequency estimators 34–38, a proportional plus integral (PI) filter 42, and a voltage controlled oscillator (VCO) or numeric controlled oscillator (NCO) 46 coupled to PI filter 42 through the sign flop 44. The input 32a to the Sequence Locator and Splitter 32 includes the PSC peak location chip-offset provided by Step 1. Start up AFC 30 is an open loop gain control block that steps through pre-defined gain levels in order to set proper input power level before digitizing the input. The main input to both Step 1 and the Sequence Locator and Splitter 32 is sampled at twice the chip rate with a length of 76,800 complex elements. Since the chip-offset points to the peak location, the beginning of the PSC is 511 samples before the chip-offset. The outputs of the Sequence Locator and Splitter 32 are generated by the following general equation:

$$\text{Output} = \text{input}[i-511]i \qquad \text{Eq. (1)}$$

Accordingly, the three particular outputs of the Sequence Locator and Splitter 32 are represented by the following equations for early (32b), punctual (32c) and late 32(d) estimates:

$$\text{Early}[i] = \text{input}[i-511]i = \text{offset}-1, \text{offset}, \text{offset}+1, \ldots, \text{offset}+510 \qquad \text{Eq. (2)}$$

$$\text{Punctual}[i] = \text{input}[i-511]i = \text{offset}, \text{offset}+1, \text{offset}+2, \ldots, \text{offset}+511 \qquad \text{Eq. (3)}$$

$$\text{Late}[i] = \text{input}[i-511]i = \text{offset}+1, \text{offset}+2, \text{offset}+3, \ldots, \text{offset}+512 \qquad \text{Eq. (4)}$$

Although the Locator and Splitter 32 in the example given in FIG. 2, is a PSC locator, it should be understood the same approach can be used with any received sequences other than PSC.

The input samples to the Sequence Locator and Splitter are taken at twice the chip rate.

The frequency estimators 34, 36 and 38 each receive one of the three inputs provided by Equations (2)–(4). The frequency estimators estimate a different frequency offset, summed at 40, for each input sequence in accordance with FIG. 1. The frequency offset, summed at 40, is the summation of early, punctual and late estimates.

Figure 3:
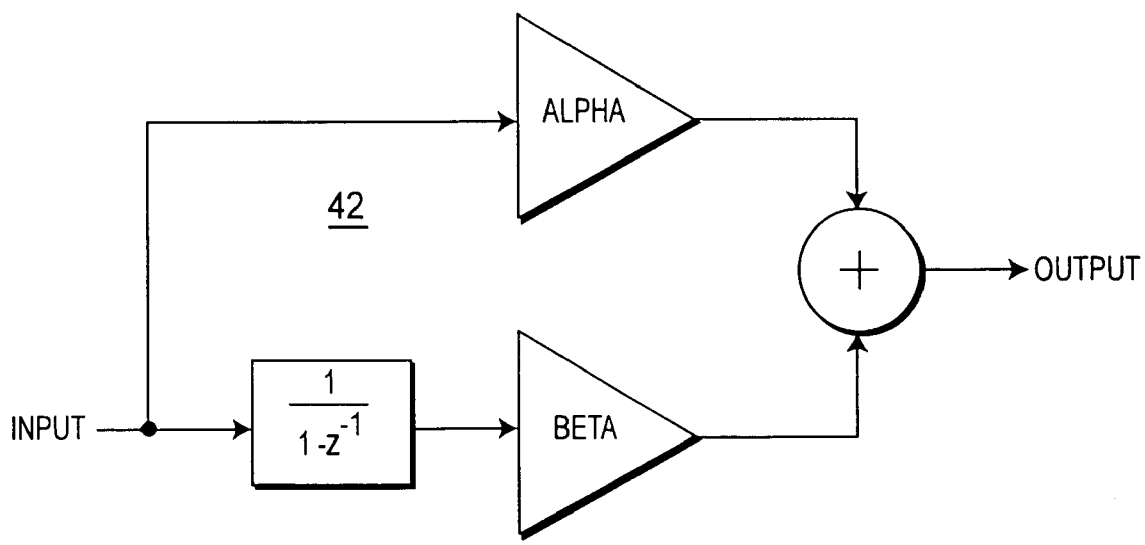
FIG. 3 shows a process diagram for a PI filter.

The sum of the estimates is passed through a proportional plus integral (PI) filter 42 with coefficients alpha and beta, respectively as shown in detail in FIG. 3. The PI filter bandwidth has two settings. Initially, alpha and beta are preferably ½ and $\frac{1}{256}$, respectively as shown in detail in FIG. 3. The loop gain k is set at (k=−1.0). During steady state, alpha and beta are set to $\frac{1}{16}$ and $\frac{1}{1024}$, respectively. FIG. 3 depicts such a PI filter structure 42. The preferable settings for coefficients alpha and beta are summarized in Table 3. However, other filters may be substituted for the PI filter.

TABLE 3

PI Filter Coefficients as a Function of Operating Conditions.

| Condition | alpha | beta |
|---|---|---|
| initial | ½ | $\frac{1}{256}$ |
| steady state | $\frac{1}{16}$ | $\frac{1}{1024}$ |

Steady state condition is established when:

the startup AFC completes at least ten (10) iterations;

while the last eight (8) outputs (inputs to VCO) are put into a buffer of length eight (8); the difference between the absolute value of the average of the first half and that of the second half is within ±1 kHz; and the current output to the VCO is within ±1 khz of the absolute value of the average of the second half.

For digital applications, a numerically controlled oscillator (NCO) is used in place of the VCO.

The start-up AFC algorithm relies on PSC location update to estimate the carrier frequency offset. Step 1 runs during frequency correction to update the PSC location. As such, it is preferable that start-up AFC is begun immediately following a successful Step 1 process, with Step 1 running in parallel. Step 1 continues to provide updated PSC locations once every N1 frames as per the Step 1 algorithm, where N1 is the maximum number of frames for averaging. Start-up AFC is run in this manner for a duration of L frames, with L=24 as the preferred value. The Step 1 FLAG 61 from controller 60 is set when a sequence is detected. The FEB 31 runs when the controller 60 provides an enable condition to FEB 31 at 62. Since the peak locations shift left or right in time, the Step 1 algorithm is run constantly. At the end of L frames, the start-up AFC reduces the frequency offset to about 2 KHz in many cases, which provides considerable enhancement to the Step 2 performance. The inclusion of L frames contributes to the overall cell search delay budget and hence is chosen conservatively to be L=24.

PSC processing block 66 correlates against the primary synchronization code in (synchronization channel) (SCH) over frames. The SCH location is not known.

SSC extractor block 68 utilizes the SCH location and extracts only the SCH portion, which is then passed to SSC processing block 70.

SSC processing block 70 correlates against the secondary synchronization code in synchronization channel over SCH.

Midamble Extractor block 72 utilizes the SCH location and SSC processing results and extracts the midamble portion to pass to midamble processing block 74.

Midamble processing block 74 correlates against possible midambles given by SSC processing and picks the one with the highest energy.

Periodic Cell Search block 76 performs a process which constantly searches for the best base station for the given period.

Controller 60 coordinates among stages to synchronize to a base station.

Layer 1 Controller 80 coordinates all layer 1 related hardware and software in order to maintain proper operation in the receiver.

What is claimed is:

1. A start-up automatic frequency control (AFC) method used during an initial cell search (ICS) processing by a user equipment (UE) receiver, comprising:
    (a) receiving input which includes a sequence;
    (b) rotating a phase of a stored sequence by a given frequency amount in a positive direction to form a positive rotated phase of the stored sequence and in a negative direction to form a negative rotated phase of the stored sequence;
    (c) correlating the received sequence with the positive rotated phase of the stored sequence; and
    (d) correlating the received sequence with the negative rotated phase of the stored sequence;
    (e) combining the outputs of the correlating steps (c) and (d) to form a frequency control signal, and automatically adjusting the frequency of the UE receiver responsive to the frequency control signal; and
    repeating step (b)–(e) to process a primary synchronization code (PSC) on a primary synchronization code channel (PSCH) for synchronization channel (SCH) location determination every N frames where N is an integer and N≧1 during ICS.

2. The method of claim 1 wherein the stored sequence is a primary synchronization code (PSC) sequence.

3. The method of claim 1 wherein step (e) further comprises;
    (f) obtaining the absolute values of the correlating steps (c) and (d).

4. The method of claim 3 wherein step (e) further comprises:
    (g) combining the absolute values obtained at step (f).

5. The method of claim 1 wherein the frequency adjustment is voltage controlled.

6. The method of claim 1 wherein the frequency adjustment is numerically controlled.

7. A start-up automatic frequency control (AFC) method used during an initial cell search (ICS) processing by a user equipment (UE) receiver, comprising:
    (a) receiving input which includes a sequence;
    (b) rotating a phase of a stored sequence by a given frequency amount in a positive direction to form a positive rotated phase of the stored sequence and in a negative direction to form a negative rotated phase of the stored sequence;
    (c) correlating the received sequence with the positive rotated phase of the stored sequence;
    (d) correlating the received sequence with the negative rotated phase of the stored sequence;
    (e) combining the outputs of the correlating steps (c) and (d) to form a frequency control signal, and automatically adjusting the frequency of the UE receiver responsive to the frequency control signal, including;
    wherein step (e) furter comprising:
        (f) obtaining the absolute values of the correlating steps (c) and (d);
        (g) combining the absolute values obtained at step (f); and
    wherein step (g) further comprising:
        (h) combining the absolute values according to the equation $$6kH \times [(a-b) \div (a+b+c)] \text{ where}$$

a = absolute value of the positive phase correlation
    b = absolute value of the negative phase correlation
    c = constant
    kH = kilo Hertz.

8. The method of claim 1 wherein:
    a received input power level is adjusted prior to step (a).

9. The method of claim 8 wherein the input is digitized after adjustment of the power level.

10. A start-up automatic frequency control (AFC) method used during an initial cell search (ICS) processing by a user equipment (UE) receiver, comprising:
    (a) receiving input which includes a sequence;
    (b) rotating a phase of a stored sequence by a given frequency amount in a positive direction to form a positive rotated phase of the stored sequence and in a negative direction to form a negative rotated phase of the stored sequence;
    (c) correlating the received sequence with the positive rotated phase of the stored sequence;
    (d) correlating the received sequence with the negative rotated phase of the stored sequence; and
    (e) combining the outputs of the correlating steps (c) and (d) to form a frequency control signal, and automatically adjusting the frequency of the UE receiver responsive to the frequency control signal;
    wherein a received input power level is adjusted prior to step (a), the input is digitized after adjustment of the power level and the power level is set employing open loop gain control.

11. The method of claim 1 wherein the ICS processing includes obtaining a primary synchronization code (PSC).

12. The method of claim 11 further comprising:
    employing the PSC to extract a secondary synchronization code (SSC) from the received input.

13. A start-up automatic frequency control (AFC) method used during an initial cell search (ICS) processing by a user equipment (UE) receiver, comprising:
    (a) receiving input which includes a sequence;
    (b) rotating a phase of a stored sequence by a given frequency amount in a positive direction to form a positive rotated phase of the stored sequence and in a negative direction to form a negative rotated phase of the stored sequence;
    (c) correlating the received sequence with the positive rotated phase of the stored sequence;
    (d) correlating the received sequence with the negative rotated phase of the stored sequence;
    (e) combining the outputs of the correlating steps (c) and (d) to form a frequency control signal, and automatically adjusting the frequency of the UE receiver responsive to the frequency control signal; and
    further comprising obtaining a primary synchronization code (PSC) and employing the PSC to extract a secondary synchronization code (SSC) from the received input wherein the PSC and SSC are utilized to extract a midamble portion from the received input.

14. The method of claim 13 wherein a midamble portion having a highest energy is selected from the extracted midamble portion.

15. The method of claim 13 wherein step (e) further comprises;
    (f) obtaining the absolute values of the correlating steps (c) and (d).

16. The method of claim 15 wherein step (e) further comprises:
   (g) combining the absolute values obtained at step (f).

17. The method of claim 16 wherein step (g) further comprises:
   (h) combining the absolute values according to the equation $$6\text{kH} \times [(a-b) \div (a+b+c)] \text{ where}$$

a = absolute value of the positive phase correlation
   b = absolute value of the negative phase correlation
   c = constant
   kH = kilo Hertz.

18. The method of claim 13 wherein:
   a received input power level is adjusted prior to step (a).

19. The method of claim 18 wherein the input is digitized after adjustment of the power level.

20. The method of claim 13 wherein the frequency adjustment is voltage controlled.

21. The method of claim 13 wherein the frequency adjustment is numerically controlled.

22. A method for adjusting frequency during an initial cell search in wireless network, comprising:
   (a) obtaining a synchronization code responsive to a received input containing a received sequence;
   (b) rotating a phase of the received sequence by a given frequency amount to form a rotated phase of the received sequence;
   (c) correlating a primary synchronization channel (PSCH) sequence with the rotated phase of the received sequence and an unrotated phase of the received sequence; and
   (d) integrating the two correlations of step (c),
whereby an AFC start-up method is performed in parallel with step (a); and
   repeating step (b)–(d) to process a primary synchronization code (PSC) on the primary synchronization code channel (PSCH) for synchronization channel (SCH) location determination every N frames where N is an integer and $N \geq 1$ during ICS.

* * * * *

UNITED STATES PATENT AND TRADEMARK OFFICE
CERTIFICATE OF CORRECTION

PATENT NO. : 7,236,547 B2
APPLICATION NO. : 11/088116
DATED : June 26, 2007
INVENTOR(S) : Alpaslan Demir It is certified that error appears in the above-identified patent and that said Letters Patent is hereby corrected as shown below:

At column 2, line 35, after the word "upper", delete "bound" and insert therefor -- boundary--.

At column 2, Table 1, line 45, before the word "Allowed", delete "Integration" and insert therefor --Integrations--.

At column 4, line 30, before the words "of the", delete "khz" and insert therefor --kHz--.

At column 4, line 49, after the words "about 2", delete "KHz" and insert therefor --kHz--.

At claim 1, column 5, line 27, after the word "repeating", delete "step" and insert therefor --steps--.

At claim 7, column 5, line 62, before the word "comprising", delete "furter" and insert therefor --further--.

At claim 22, column 8, line 15, after the word "repeating", delete "step" and insert therefor --steps--.

Signed and Sealed this

Eleventh Day of December, 2007

JON W. DUDAS
*Director of the United States Patent and Trademark Office*